United States Patent
Tzou et al.

(10) Patent No.: US 6,939,808 B2
(45) Date of Patent: Sep. 6, 2005

(54) UNDOPED AND FLUORINATED AMORPHOUS CARBON FILM AS PATTERN MASK FOR METAL ETCH

(75) Inventors: Eugene Tzou, San Jose, CA (US); Jie Yuan, San Jose, CA (US); Yan Ye, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 217 days.

(21) Appl. No.: 10/211,453

(22) Filed: Aug. 2, 2002

(65) Prior Publication Data

US 2004/0023502 A1 Feb. 5, 2004

(51) Int. Cl.[7] ............................................. H01L 21/302
(52) U.S. Cl. .................................... 438/706; 438/720
(58) Field of Search ............................. 438/706, 710, 438/714, 719, 720, 723, 724, 725, 717

(56) References Cited

U.S. PATENT DOCUMENTS

| | | | |
|---|---|---|---|
| 5,279,702 A | 1/1994 | Douglas | |
| 5,362,350 A | 11/1994 | Yanagida | |
| 5,387,315 A | 2/1995 | Sandhu | |
| 5,505,322 A | 4/1996 | Shinohara et al. | |
| 5,515,985 A | 5/1996 | Ohshita et al. | |
| 5,830,332 A | 11/1998 | Babich et al. | |
| 5,965,934 A | * 10/1999 | Cheung et al. | ............. 257/642 |
| 6,017,826 A | 1/2000 | Zhou et al. | |
| 6,197,704 B1 | * 3/2001 | Endo et al. | .................. 438/781 |
| 6,558,756 B2 | * 5/2003 | Sugahara et al. | ........... 427/490 |
| 6,673,684 B1 | * 1/2004 | Huang et al. | ............... 438/299 |
| 2004/0023475 A1 | * 2/2004 | Bonser et al. | .............. 438/585 |

OTHER PUBLICATIONS

S.Wolf, "Silicon Processing for the VLSI Era", vol. 4, p. 711.*

Stanley Wolf, "Silicon Processing for the VLSI Era vol. 4: Deep–Submicron Process Technology Chapter 16", Lattice Press, 2002.

* cited by examiner

Primary Examiner—Kin-Chan Chen
(74) Attorney, Agent, or Firm—Townsend & Townsend & Crew

(57) ABSTRACT

A method for etching a metal layer formed on a substrate to form a metal line, using an amorphous carbon layer as a pattern mask. One embodiment of the method of the invention etches a metal layer formed on a substrate, for forming a metal line, by depositing an amorphous carbon layer on the metal layer, patterning the amorphous carbon layer to provide a pattern mask on the metal layer, thus exposing portions of said metal layer; and etching the exposed portions of the metal layer, to form a metal line. In an embodiment, the metal layer comprises a copper layer.

21 Claims, 4 Drawing Sheets

UNDOPED AND FLUORINATED AMORPHOUS CARBON FILM AS PATTERN MASK FOR METAL ETCH

BACKGROUND OF THE INVENTION

The present invention is related to wafer processing and in particular to a method of etching a metal layer to form interconnect structures in integrated circuits (IC). More specifically, the present invention relates to a method of using a hard mask deposited by a chemical vapor deposition process as a pattern mask for etching copper-based interconnect structures.

For the past few decades, chip makers have etched aluminum circuits on silicon wafers. However, the ever shrinking universe of integrated circuits has made the use of aluminum as an interconnect structure problematic. Accordingly, much of the industry is switching to copper for conduction lines in circuits having minimum feature sizes of 0.2 micron or less. Copper has less resistance than aluminum, and therefore transmits electrical signals faster. More specifically, copper wires conduct electricity with about 40 percent less resistance than aluminum. This translates into a speed up of as much as 15 percent in microprocessors that contain copper wires. Copper wires are also less vulnerable than those made of aluminum to electromigration, the movement of individual atoms through a wire caused by high electric currents. In addition, the widths of copper wires can be squeezed down to the 0.2 micron range and below from the current widths—a reduction far more difficult for aluminum.

Several different copper integration options are being pursued by semiconductor manufacturers. Among these are the "Damascene" and the subtractive etch approaches. While many have adopted a damascene-based process as a method of depositing copper interconnects onto silicon, others are developing methods to etch copper interconnects onto a substrate. Damascene-based local on-chip interconnections have been used since the late 1980s and have since gained popularity in the semiconductor manufacturing industry. Currently, the damascene method appears to be the more commercially feasible method of fabricating submicron copper-based interconnections, primarily because of the difficulty of etching copper at these levels.

One problem with etching copper is the requirement for an elevated temperature etch (e.g., higher than 200° C.). The need for an elevated temperature etch is in turn driven by the insufficient volatilization of copper etch products at low temperatures (e.g., lower than 200° C.). Additionally, the need for an elevated temperature etch is driven by a need to etch copper at high etch rates (e.g., 5000 Å/min). Therefore, in order to rapidly etch copper, sufficient volatilization of copper etch products is required, which is achieved by increasing the wafer temperature during copper etching. However, typical masks made from conventional photoresist materials will break down at temperatures higher than 200° C., and thus are not suitable for use as masks for the etching of copper. There is therefore a need for a high temperature mask for copper etch; a mask that is stable at the elevated temperatures needed to etch copper at rates high enough for commercially viable semiconductor manufacturing. Besides the temperature stability issues described above, it is known that typical photoresist layers deposited by spin-on methods have layer thickness uniformity problems, with the uniformity problems being more pronounced for thinner layers (e.g., less than 8000 Å). So, besides needing a mask material that is stable at high temperatures, such a mask needs to avoid the layer thickness uniformity problems associated with typical spin-on deposited photoresist materials.

Copper etching is typically carried out using chlorine-based chemistries. Typical photoresist materials have a low etch selectivity with respect to the metal being etched using chlorine-based chemistries, thus requiring rather thick layers of the photoresist materials. It is preferred to use a mask material having a higher etch selectivity with respect to the metal being etched. For example, the etch selectivity for conventional photoresist with respect to copper is 2:1, while a preferred etch selectivity should be at least greater than 3:1. Some research institutions have investigated the reactive ion etching of copper in chlorine-based plasmas using $SiO_2$ or $Si_3N_4$ (commonly abbreviated as SiN) hard masks. The results of these investigations show that copper dry etching using $SiO_2$ and SiN hard masks is possible at substrate temperatures as low as 165° C. However, the etch selectivity of copper with respect to $SiO_2$ and SiN is generally considered to be too low for the process to be efficient in a commercial setting. Furthermore, $SiO_2$ and SiN masks are also generally considered to be difficult to remove after copper etching. $SiO_2$ and SiN masks are difficult to remove, because their removal generally requires using strong chemicals and strong physical bombardments, that also could damage the underlying layers (e.g. copper layer).

A fluorinated amorphous carbon film having both thermal stability and a low dielectric constant has been developed by the assignee herein for use as a low k dielectric material, and is described in a pending U.S. patent application Ser. No. 08/948,799, filed Oct. 10, 1997, entitled "Method of Depositing an Amorphous Fluorocarbon Film Using HDP-CVD." While this film has the requisite thermal stability for use a pattern mask for etching of metals, its use for such a purpose was not previously contemplated. This is because previous methods involved the etching of aluminum which happens at temperatures below 100° C., and thus a high temperature mask was not needed. Moreover, while an amorphous fluorinated carbon film has the requisite thermal stability, its etch rate using a chlorine-based plasma etch process is also too high with respect to the underlying metal, and thus results in an etch selectivity which is too low for the process to be viable.

A type of amorphous carbon (a-C) film that has attracted interest because of its unique diamond like characteristics is the so-called diamond like carbon (DLC) film. While the DLC film is similar to the amorphous fluorinated carbon (a-FC) film described above, and while it may have a better etch selectivity than the a-FC film, its deposition occurs at temperatures in excess of 800° C., which is higher than the commonly accepted 450° C. substrate temperature threshold for typical semiconductor processing.

There is therefore a need for a feasible method of fabricating copper-based interconnections based on etching copper at the submicron level. More particularly, there is a need for a pattern mask for etching of copper, that can be deposited thinly and uniformly, while maintaining the wafer's temperature below 450° C.; a mask that is thermally stable at the elevated temperatures needed for copper etching, and one that provides for a high etch selectivity with respect to the underlying metal.

SUMMARY OF THE INVENTION

Embodiments of the present invention relate to a method for etching a metal layer formed on a substrates to form a metal line, using an amorphous carbon layer as a pattern mask. One embodiment of the method of the invention etches a metal layer formed on a substrate, for forming a metal line, by depositing an amorphous carbon layer on the metal layer, patterning the amorphous carbon layer to provide a pattern mask on the metal layer, thus exposing portions of said metal layer and etching the exposed portions of the metal layer, to form a metal line. In an embodiment, the metal layer comprises a copper layer.

One embodiment of the method of the invention patterns the amorphous carbon layer by first depositing a layer of a silicon-based film on the amorphous carbon layer, followed by depositing a layer of a photoresist material on the silicon-based film. The photoresist layer is then patterned according to a wiring pattern to partially expose the silicon-based film. Then, using the photoresist layer as a mask, the silicon-based film is patterned to partially expose the amorphous carbon layer, and finally, using the silicon-based film as a mask, the amorphous carbon film is patterned to partially expose the metal layer.

In some embodiments of the method of the invention, the pattern mask structure formed above the metal layer further includes a liner film layer deposited before the amorphous carbon film, to enhance the adhesion of the amorphous carbon film to its neighboring layers. Likewise, in some embodiments, the pattern mask structure further includes a liner film layer deposited above the amorphous hard mask, to enhance the adhesion of the amorphous carbon film to its neighboring layers.

The amorphous carbon mask is deposited by a HDP-CVD process, thus forming a uniform layer of amorphous carbon for use a pattern mask. The amorphous carbon film may be annealed before it is patterned to enhance its thermal stability. During the deposition of the amorphous carbon film, the substrate's temperature remains low enough to minimize thermally-induced damage to the substrate. Furthermore, the deposited amorphous carbon hard mask is thermally stable at elevated temperatures, thus enabling its use as a pattern mask suitable for the high temperature etching of a copper layer for forming interconnect structures. In addition to its uniform deposition and its thermal stability during high temperature etching of metal, the amorphous carbon pattern mask is also easily removable after the metal etch, using an $O_2$ or $H_2$ plasma process.

These and other embodiments of the present invention, as well as its advantages and features, are described in more detail in conjunction with the description below and attached figures.

DESCRIPTION OF THE SPECIFIC EMBODIMENTS

Figure 1:
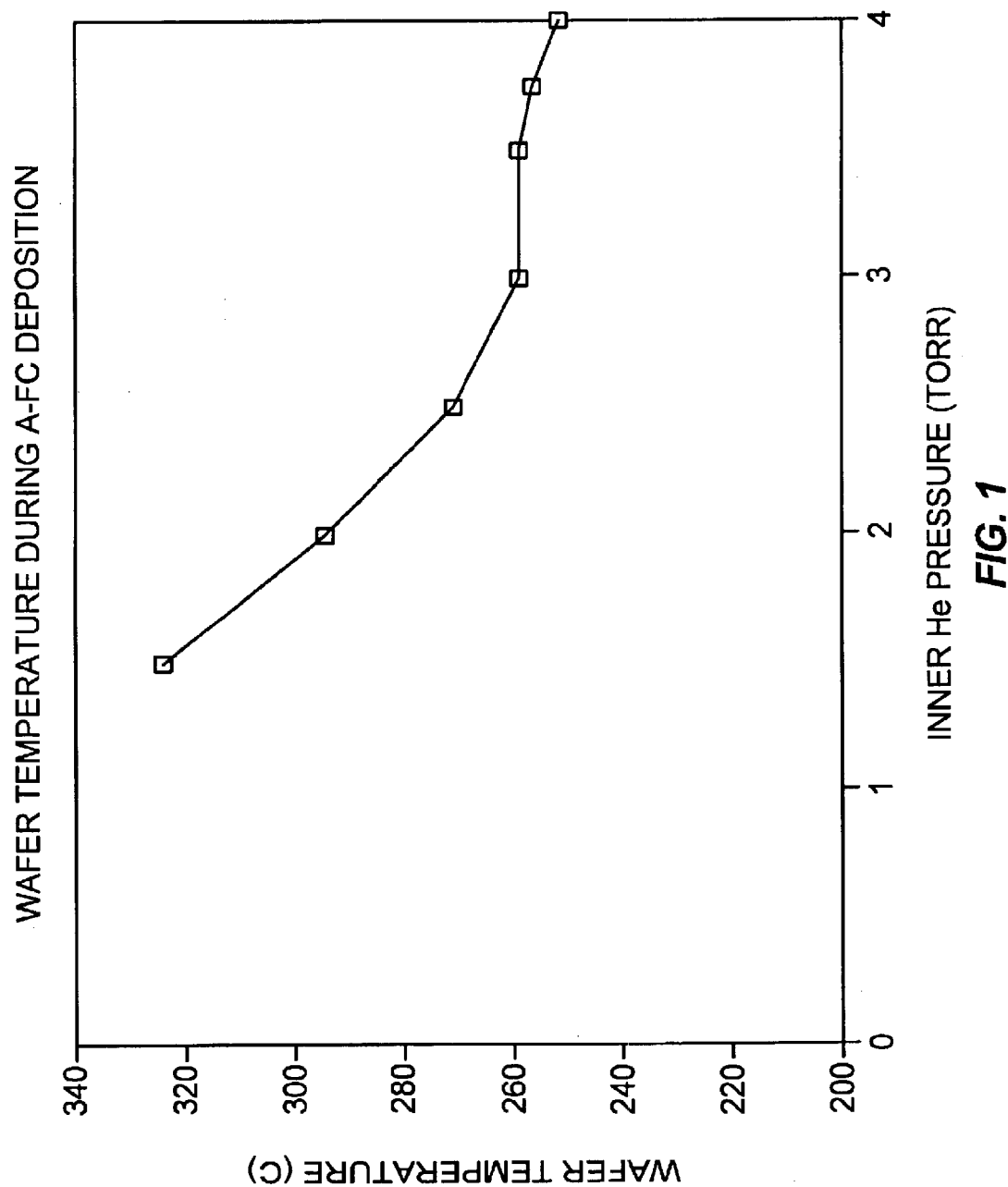
FIG. 1 is a plot of wafer surface temperature during amorphous fluorinated amorphous carbon deposition.

Embodiments of the present invention are directed to methods of etching a metal layer formed on a substrate using an amorphous carbon film as a pattern mask. Accordingly, the description provided below, first sets forth a method for depositing the amorphous carbon mask, and then describes a method for etching a metal layer, using the amorphous carbon layer as a pattern masks, to form metal lines.

I. Process to Deposit Amorphous Carbon (a-C) and Fluorinated Amorphous Carbon (a-FC) Films In an embodiment, the undoped and/or fluorinated amorphous carbon film is deposited using a high density plasma chemical vapor deposition (HDP-CVD) system, using the deposition recipe described below. Such a CVD system includes a chamber, a vacuum system, a source plasma system, a bias plasma system, a gas delivery system, and a remote plasma cleaning system. An example of a system that may incorporate some or all of these systems would be the ULTIMA™ system, manufactured by APPLIED MATERIALS, INC., of Santa Clara, Calif., configured to practice aspects of the present invention. Further details of such a system are disclosed in U.S. patent application Ser. No. 08/679,927, filed Jul. 15, 1996, entitled "Symmetric Tunable Inductively-Coupled HDP-CVD Reactor," assigned to the assignee herein, the entire disclosure of which is incorporated herein by reference. The description of the system provided in the above-incorporated application is for exemplary purposes only. It would be a manner of routine skill for a person of skill in the art to select an appropriate conventional substrate processing system and computer control system to implement this aspect of the present invention.

The sequence of operation of a commercial HDP-CVD system is well known and needs no explanation for the embodiments of the present invention, and hence only the key deposition steps are described below. The undoped amorphous carbon film is deposited by a HDP-CVD process. Using such a process, a wafer is placed in the processing chamber and processed as follows. The high density plasma is generated using inductively coupled RF power in a range between 500 and 4000 watts with argon (Ar) as an inert carrier gas at a rate between 0 and 150 standard cubic feet per minute (sccm) and $CH_4$ reaction gas at rate between 50 and 150 sccm. Alternately, The wafer could be biased by a capacitively coupled RF power in a range between 500 and 4000 watts during the film's deposition to obtain a dense film with high thermal stability. The chamber pressure during the deposition is maintained in a range between 5 and 20 millitorr (mT). In addition to the use $CH_4$ of as a source of carbon, other gasses such as $C_2H_6$, $C_2H_2$ and $C_6H_6$ may also be used.

The fluorinated amorphous carbon film is deposited in a similar manner as the undoped amorphous carbon film with addition of $C_4F_8$ for fluorine doping. For fluorine doping, the flow rate of $C_4F_8$ is in a range between slightly greater 0 and 150 sccm. The flow rate ratio of $C_4F_8$ to $CH_4$ is important for the doping level and the thermal stability of the doped carbon film. For an unbiased process, the flow rate ratio of $C_4F_8$ to $CH_4$ is between 0.2 and 2, and for a biased process, the range is narrower and is between 0.7 and 1.3. More particularly, Table 1 below shows the effect of the gas flow ratios on the fluorine doping level in the final film.

TABLE 1

Fluorine doping Levels vs. $C_4F_8$:$CH_4$ Flow Rate Ratios

| $C_4F_8$:$CH_4$ Flow Rate (sccm) | Fluorine Conc. (atomic %) |
|---|---|
| 0:120 | 5 |
| 31:35 | 30 |

TABLE 1-continued

Fluorine doping Levels vs. $C_4F_8$:$CH_4$ Flow Rate Ratios

| $C_4F_8$:$CH_4$ Flow Rate (sccm) | Fluorine Conc. (atomic %) |
|---|---|
| 35:35 | 40 |
| 31:0 | 48 |

As can be seen from Table 1, a less doped amorphous carbon film is deposited by reducing the flow rate of $C_4F_8$. Using the recipe described above, the $CH_4$ provides polymerization of carbon to form carbon-carbon chains and the $C_4F_8$ provides the fluorine doping. Additionally, it should be noted that although the flow rate for the $C_4F_8$ is zero, Table 1 shows that the deposited film has an atomic fluorine concentration of 5%. This fluorine concentration is due to the chamber clean process that takes place after certain number of depositions. The chamber clean includes oxygen ($O_2$) RF plasma as well as $NF_3$ microwave clean. The $NF_3$ brings fluorine impurity into the chamber as well as the deposited film. Due to the chamber clean process, fluorine concentrations are observed in the film during initial film depositions, even though no additional fluorine-containing gas is being delivered to the process chamber. Adjusting the chamber clean processes to avoid unwanted fluorine concentrations is known to those skilled in the CVD deposition techniques. In addition to the use of $C_4F_8$ as a fluorine source other gasses such as $CF_4$, $C_2F_6$, $C_3F_8$, $C_4F_8$, $CHF_3$ and $C_6F_6$ may also be used for fluorine doping.

In certain embodiments, the a-C or a-FC film may also be annealed after its deposition to enhance its thermal stability. Annealing may be carried out in vacuum, or in an inert atmosphere composed of gasses such as argon (Ar) or nitrogen ($N_2$), at a temperature between 300° C. and 450° C. for approximately 30 minutes. Further details of a method and tool used to deposit a doped fluorinated amorphous carbon film are disclosed in a commonly assigned and copending U.S. patent application Ser. No. 08/948,799, filed Oct. 10, 1997, entitled "Method of Depositing An Amorphous Fluorocarbon Film Using HDP-CVD," which is incorporated herein by reference in its entirety.

In alternate embodiments, an additional liner layer may be deposited before and optionally after the deposition of the amorphous carbon film to enhance the amorphous carbon film's adhesion to its neighboring films. As used herein, a thin layer is a layer having a thickness between 200 Å and 1000 Å. The liner layer may be composed of SiOx or SiCx layers using recipes known in the art. For example, the SiOx layer may be deposited in the same chamber, by introducing oxygen ($O_2$) at approximately 70 sccm and $SiH_4$ at approximately 60 sccm. The SiCx liner layer may be deposited in the same chamber under the same conditions by introducing $CH_4$ at approximately 60 sccm and $SiH_4$ at approximately 30 sccm.

The a-C or the a-FC films when used as a pattern mask have the following advantages that are desirable for metal etch.

First, the undoped or fluorinated amorphous carbon film is deposited by a HDP-CVD process. Using this process the film thickness and uniformity is well controlled, and if needed, a much thinner film may be deposited compared to spin-on photoresist film. A thickness distribution map, obtained using known methods, of a 200 mm wafer coated with a HDP-CVD deposited layer of undoped amorphous carbon film shows that the deposited film has a mean thickness of 2402.6 Å, and a standard deviation of 85 Å. This standard deviation value shows that the maximum deviation from the mean thickness is less than 4% of the film's thickness, or in other words, the film thickness is very uniform.

Likewise, a thickness distribution map of a 200 mm wafer coated with a HDP-CVD deposited layer of fluorine doped amorphous carbon film showed that the deposited film has a mean thickness of 2093 Å, and a standard deviation of 30 Å. This standard deviation value shows that the maximum deviation from the mean thickness is at most less than 2% of the film's deposited thickness.

In comparison, spun-on films having a mean thickness in the same range, typically have maximum deviations from the mean film thickness in the range between 50 Å and 500 Å. Hence, depositing the amorphous carbon film for use as a pattern mask using a HDP-CVD process allows for the deposition of a film having a uniform film thickness.

Second, the undoped or fluorinated amorphous carbon film is deposited using a HDP-CVD process, where the wafer temperature during deposition is lower than 450° C., and thus is compatible with semiconductor manufacturing processes. A material having substantially similar chemical properties to the amorphous carbon film being used as a pattern mask is the diamond like carbon (DLC) film. DLC film consists primarily of metastable amorphous carbon film and contains both hybridized tetragonal sp3 and trigonal sp2 bonds. The DLC film is a very hard film with good surface smoothness. Although a DLC film could potentially be used as a mask, it is typically deposited in a CVD process having a deposition temperature in excess of 800° C. It is well-known that substrate temperatures in excess of 450° C. during wafer processing are not compatible with semiconductor processing. The deposition temperature of the amorphous carbon film of the present invention is much lower than typical deposition temperatures that are used to deposit diamond like carbon (DLC) films. FIG. 1, which is a plot of wafer surface temperature during amorphous fluorinated carbon deposition, shows that the substrate temperature during the deposition of the film is in the range between 240° C. and 340° C., which is far lower than the 450° C. limit for semiconductor processing.

Figure 2:
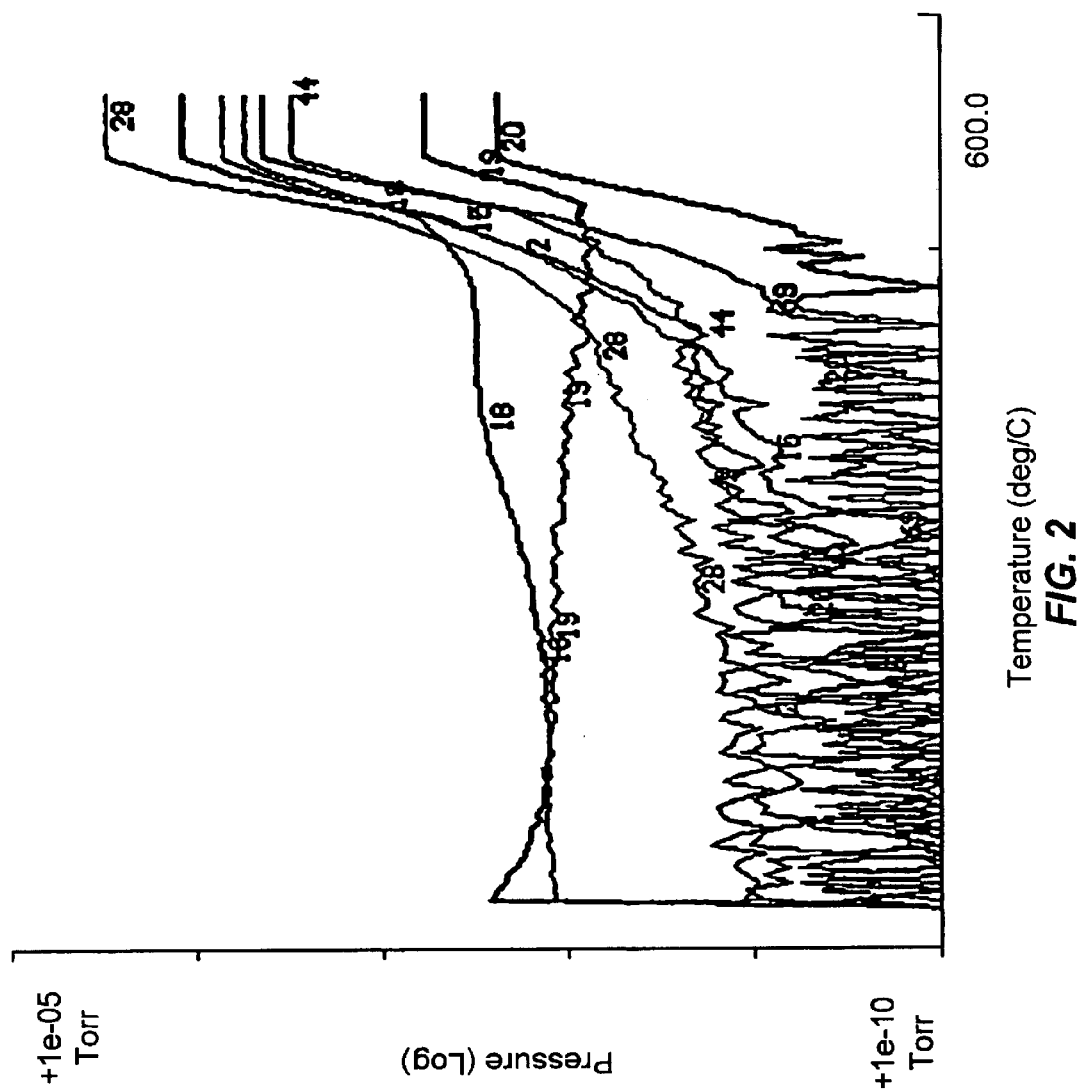
FIG. 2 is a graph showing the results of a thermal desorption spectroscopy (TDS) of an undoped amorphous carbon film.
Figure 3:
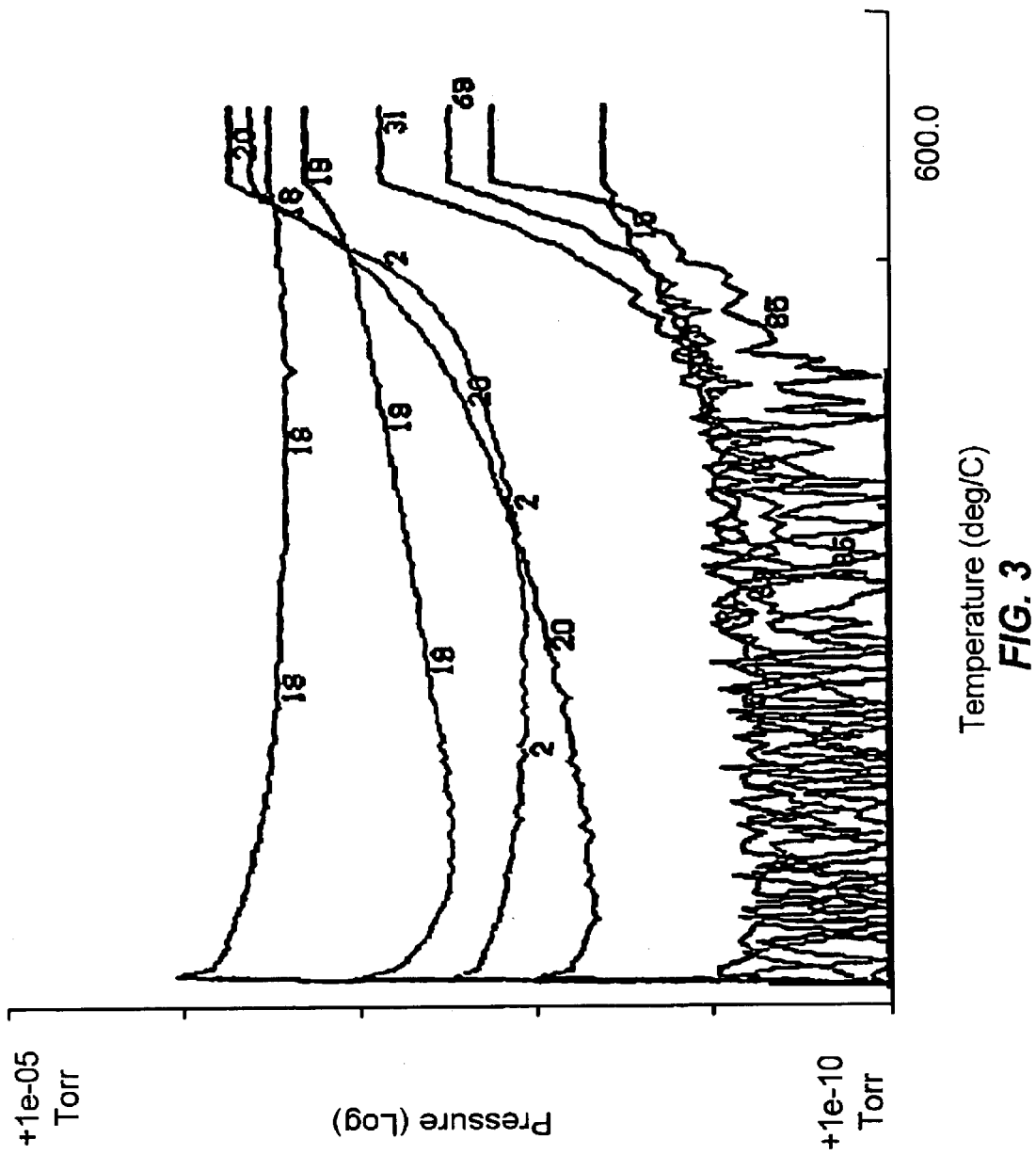
FIG. 3 is a graph showing the results of a thermal desorption spectroscopy (TDS) of a fluorinated amorphous carbon film.

A third advantage of using the amorphous carbon film as a pattern mask for metal etch is that the film is thermally stable at elevated temperatures up to approximately 400° C. Thermal stability means that the film will not suffer from weight loss, deformation or chemical reactions when exposed to etch environments at temperatures between 200° C. and 400° C. The thermal stability of the film at elevated temperatures, will allow for its use as a mask for etch operations that are performed at temperatures higher than 200° C. As described above, etching of copper using chlorine based chemistries requires temperatures during etching to be higher than 200° C. It is known that typical photoresist materials are not stable for etch processes which require the substrate temperature to be 200° C. or higher, and hence would be unsuitable for the etching of copper. FIG. 2 shows a thermal desorption mass spectroscopy data for the undoped amorphous carbon film. As can be seen from this figure, the undoped film is thermally stable up to approximately 400° C. and begins to break down between 450° and 500° C. FIG. 3 shows similar results for the doped amorphous carbon film.

A fourth advantage of using an amorphous carbon film as a pattern mask for metal etch is that the etch selectivity between amorphous carbon film mask and metal is tunable with fluorine doping level. Table 2 below shows the variation in the etch rate of the amorphous carbon mask as a function of the fluorine concentration. This table also shows the etch rates in comparison to etch rate of silicon oxide, which may be used as another hard mask. The films were etched in a decoupled plasma source (DPS) etch reactor using chlorine as the reacting gas. The DPS Centura™ reactor supplied by Applied Materials, Inc. of Santa Clara, Calif. is an example of such a DPS reactor which may be used to etch the doped or undoped amorphous carbon films used as hard masks. The DPS Centura™ reactor is capable of operating in a wide process window, capable of etching a variety of mask types and pattern densities over large power and pressure range. The DPS Centura™ chamber may be configured to etch metal, as well as silicon and hard masks. The process of operation of a such a commercial etch system is well known and needs no explanation for the practice of the etch recipes described below for the embodiments of the present invention. A recipe used to etch the amorphous carbon hard mask using such a reactor uses, for example, oxygen gas at a flow rate of 80 sccm, chlorine at 60 sccm while maintaining a source RF power at 1500 watts, and a bias RF power at 400 Watts.

The results summarized in Table 2 show that undoped amorphous carbon film is preferred for use as a mask for etching of metals, such as copper, since it will etch slower and allow for a higher etch selectivity. As shown in Table 2, the undoped amorphous carbon film is etched at a rate of 892 Å/min as compared to the fluorine doped carbon film (etched at a rate of 2339 Å/min). This table (Table 2) also shows that the etch rate for the undoped film is also slower than the etch rate of $SiO_2$, thus having a better etch selectivity than that of $SiO_2$. Moreover, the undoped amorphous carbon film is preferred, because the lack of fluorine in the undoped film avoids some of the adverse reactions seen in certain highly fluorinated films where unstable fluorine attacks copper barrier layers.

A fifth advantage of using an amorphous carbon film as a hard mask is that it is easily removable in an etching chamber or a strip chamber after metal etch using an $O_2$-based plasma. It is known that $SiO_2$ or $Si_3N_4$ when used as pattern masks for metal etching, are difficult to remove after the metal etch. The difficulty associated with the removal of $SiO_2$ or $Si_3N_4$ is due to the strong chemistries and strong physical bombardments needed to remove such films, which can also damage any underlying structures such as, for example, the underlying metal layer(s).

TABLE 2

Etch Rate Comparisons - Undoped and Fluorinated Amorphous Carbon Film

| Film | Fl. Content % | Etch Rate (Å/min) |
|---|---|---|
| $SiO_2$ | 0 | 1056 |
| a-C | 0 | 892 |
| a-FC | 30 | 2339 |

Having described the deposition, suitability and advantages of using amorphous carbon films (and optionally with fluorine doping) for use as a pattern mask for metal etch, the use of such films for etching a metal layer is described below.

II. Use of Amorphous Carbon Film as Pattern Mask for Metal Etch

Copper (Cu) is most commonly etched using chlorine-based chemistries. Chlorination of Cu and volatilization of the reaction products (e.g., $(CuCl)_3$) are essential steps during the etching of copper in chlorine based-chemistries. When etching copper, by increasing the temperature of the reaction, the quantities of volatile reaction products also increase, hence increasing the etch rate of the copper layer. It follows then, that a commercially viable etching of copper using chlorine-based chemistries requires the process to be carried out at elevated temperatures, e.g., temperatures higher than 300° C.

Figure 4A:
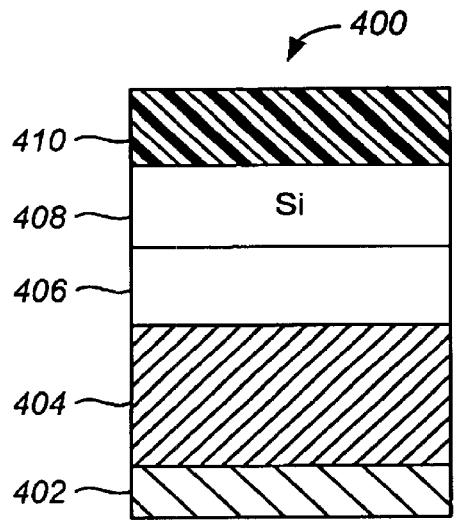
FIGS. 4A–F are simplified cross-sectional views of a process of patterning the amorphous carbon film and etching the metal layer, according to an embodiment of the present invention.
Figure 4B:
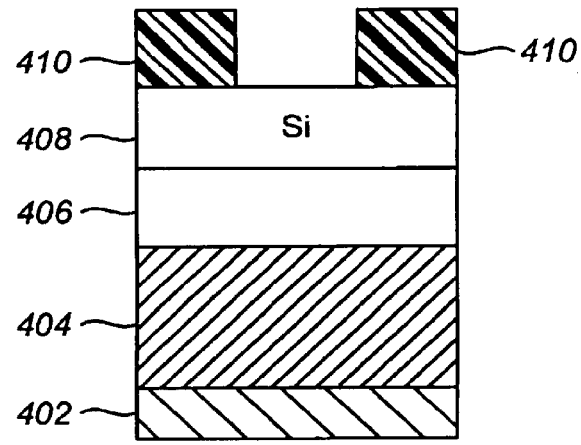

In accordance with an embodiment of the present invention, the etching of Cu using a patterned amorphous carbon film is described below in conjunction with FIGS. 4A–F. Recipes used for the deposition and the etching of the film and the metal are as described above using the above described chambers and reactors. FIG. 4A shows a substrate 402 having metal layer 404 deposited thereon. In an embodiment, a three layer structure is deposited in the sequence of a-C (or a-FC) 406, a Si-based layer 408 and photoresist 410. The top two layers, namely, the photoresist 410 and the Si based hard mask layer 408, are deposited to define a pattern on the a-C (or a-FC) film 406. The Si-based layer may be a $SiO_2$, a SiC or a SiN layer. Once the three-layer stack has been formed as shown in FIG. 4A, the photoresist layer 408 is patterned using conventional methods known in the art to result in the stack shown in FIG. 4B. FIG. 4B shows the stack of FIG. 4A with an etched photoresist layer 408, thus partially exposing the Si-based layer.

Figure 4C:
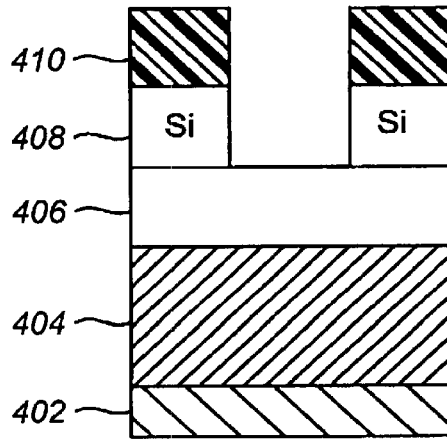
Figure 4D:
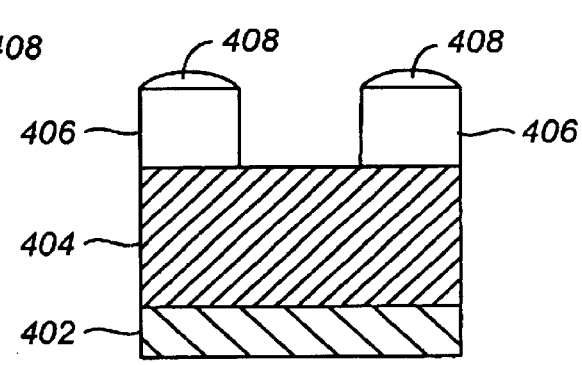
Figure 4E:
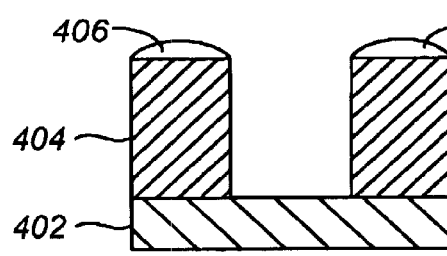
Figure 4F:
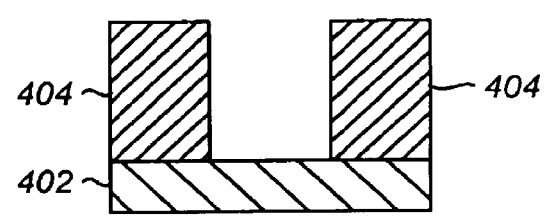

Next, as shown in FIG. 4C, the Si based layer is patterned and etched to expose the a-C layer using known etch chemistries. Next, as shown in FIG. 4D, the amorphous carbon layer is opened up to expose the metal layer beneath. As shown in FIG. 4D, the photoresist layer is etched away completely. Also shown in FIG. 4D, the Si-based layer is also partially consumed. Next, as shown in FIG. 4E, the metal layer is etched with high selectivity with respect to the amorphous carbon layer. As used herein, high etch selectivity is a selectivity greater than 3:1. However, partial etching of the amorphous carbon layer does occur. Moreover, during the metal etch, the Si-based layer is completely removed. During the last step, shown in FIG. 4F, any residual amorphous carbon film is removed by an ashing process as is known in the art, for example, by using an $O_2$ or $H_2$ containing plasma. The deposition of the amorphous carbon hard mask and the subsequent Cu etching described above in conjunction with FIGS. 4A–F is meant to be illustrative of the process of patterning of carbon film for metal etch and is not meant to be limiting the scope of the present invention which is set forth in the claims.

For example, in an alternate embodiment, the three-layer stack described above can include an additional liner layer that is deposited before and optionally after the deposition of the amorphous carbon film to enhance the amorphous carbon film's adhesion to its neighboring films. As used herein, a thin layer is a layer having a thickness between 200 Å and 1000 Å. The liner layer may be composed of SiOx or SiCx layers using recipes known in the art. For example, the SiOx layer may be deposited in the same chamber, by introducing oxygen ($O_2$) at approximately 70 sccm and $SiH_4$ at approximately 60 sccm. The SiCx liner layer may be deposited in the same chamber under the same conditions by introducing $CH_4$ at approximately 60 sccm and $SiH_4$ at approximately 30 sccm.

Moreover, in certain embodiments, the amorphous carbon film may also be annealed after its deposition to enhance its thermal stability. Annealing could be carried out in vacuum, or in an inert atmosphere composed of gasses such as argon (Ar) or nitrogen ($N_2$), at a temperature between 300° C. and 450° C. for approximately 30 minutes.

Furthermore, besides using the amorphous carbon film as a pattern mask for metal etch, as described above, the amorphous carbon film may also be used as a patterned hard mask for the etching of other films, including dielectric layers.

Having fully described several embodiments of the method of the present invention for the etching of a metal layer on a substrate using an amorphous (undoped and doped) carbon film as a pattern mask as described above, many other equivalent or alternative methods of using such a pattern mask according to the present invention will be apparent to those skilled in the art. These equivalents and alternatives are intended to be included within the scope of the present invention which is set forth in the following claims.

What is claimed is:

1. A method of etching a copper layer formed on a substrate, for forming a copper line, comprising:

depositing a stack of layers consisting of an amorphous carbon layer and one or more silicon-containing layers directly on said copper layer;

forming a photoresist layer directly on said stack of layers;

using said photoresist layer to pattern one or more layers in said stack of layers;

using said stack of layers as a pattern mask to pattern said amorphous carbon layer and expose portions of said copper layer; and using said amorphous carbon layer as a pattern mask to etch said exposed portions of said copper layer to form said copper line.

2. The method of claim 1 wherein said depositing an amorphous carbon layer further comprises:

introducing a substrate into a process chamber and positioning the substrate on a support member;

introducing a carbon source gas into said process chamber; and delivering a source of power to said chamber sufficient to strike a plasma in said chamber.

3. The method of claim 2 wherein said delivering a source of power comprises providing an inductively coupled RF power source between 500 and 4000 watts.

4. The method of claim 2 wherein said delivering a source of power comprises providing a capacitively coupled RE power source between 500 and 4000 watts.

5. The method of claim 2 wherein said introducing a carbon source gas comprises introducing a gas selected from the group consisting of $CH_4$, $C_2H_6$, $C_2H_2$ and $C_6H_6$.

6. The method of claim 2 further comprising annealing said amorphous carbon layer at a temperature between approximately 300° C. and 450° C. for approximately 30 minutes.

7. The method of claim 6 wherein said annealing further comprises maintaining a near vacuum environment, wherein a near vacuum environment is an environment having pressure in the range between 5 and 30 millitorr.

8. The method of claim 6 wherein said annealing further comprises maintaining an inert environment.

9. The method of claim 2 further comprising introducing a fluorine source gas said process chamber to form a fluorine doped amorphous carbon film.

10. The method of claim 9 wherein said introducing a fluorine gas source comprises providing a source gas selected from the group consisting of $CF_4$, $C_2F_6$, $C_3F_8$, $C_4F_8$, $CHF_3$ and $C_6F_6$.

11. The method of claim 9 wherein said etching includes the etching of said amorphous carbon layer and wherein said etching of the amorphous carbon layer is adjustable by adjusting the fluorine doping level, whereby an increase in the fluorine doping level results in an increase in said amorphous carbon layer's etch rate and a decrease in the fluorine doping level results in a decrease in said amorphous carbon layer's etch rate.

12. The method of claim 9 further comprising delivering said fluorine source gas and said carbon source gas at a flow ratio of said fluorine source gas to said carbon source gas in range between 0.2 and 2 when said support member is not connected to a bias power source, and between 0.7 and 1.3 when said support member is connected to a bias power source.

13. The method of claim 1 wherein said depositing an amorphous carbon layer comprises depositing an amorphous carbon layer having a thickness variation that is less than 4 percent of the average layer thickness.

14. The method of claim 1 wherein said depositing of said amorphous carbon layer comprises maintaining said substrate's surface temperature below 450 ° C. during said depositing.

15. The method of claim 1 wherein said depositing an amorphous carbon layer comprises depositing an amorphous carbon layer that is thermally stable up to 400 ° C.

16. The method of claim 1 wherein said stack of layers comprises a silicon-containing liner layer below said amorphous carbon layer.

17. The method of claim 16 wherein said amorphous carbon layer is doped with fluorine.

18. The method of claim 1 wherein said stack of layers comprises a silicon-containing liner layer above said amorphous carbon layer.

19. The method of claim 16 or 18 wherein said silicon-containing liner layer is selected from the group consisting of $SiO_2$, $SiC$, and $Si_3N_4$.

20. The method of claim 1 wherein said etching comprises maintaining the substrate's temperature between approximately 200° and 400° C.

21. The method of claim 1 wherein said stack of layers includes a silicon-containing liner layer above and below said amorphous carbon layer.

* * * * *